(12) United States Patent
Kintis et al.

(10) Patent No.: US 7,844,241 B2
(45) Date of Patent: Nov. 30, 2010

(54) HIGH LINEARITY FREQUENCY CONVERSION SYSTEM AND METHOD

(75) Inventors: Mark Kintis, Manhattan Beach, CA (US); Flavia S. Fong, Monterey Park, CA (US); Steve Maas, Long Beach, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 903 days.

(21) Appl. No.: 11/783,435

(22) Filed: Apr. 10, 2007

(65) Prior Publication Data

US 2008/0254759 A1 Oct. 16, 2008

(51) Int. Cl.
*H04B 1/26* (2006.01)
*H04B 15/00* (2006.01)

(52) U.S. Cl. .................. 455/323; 455/214; 455/313; 455/336

(58) Field of Classification Search ............... 455/333, 455/319, 313, 323, 214, 336, 315–320, 325–327, 455/205, 208–209, 252.1, 255
See application file for complete search history.

(56) References Cited

U.S. PATENT DOCUMENTS

| | | | |
|---|---|---|---|
| 3,772,599 A | | 11/1973 | Ernst et al. |
| 4,287,603 A | | 9/1981 | Moser |
| 4,485,488 A | | 11/1984 | Houdart |
| 4,660,006 A | | 4/1987 | Tajima et al. |
| 4,956,568 A | * | 9/1990 | Su et al. ................ 327/321 |
| 5,014,018 A | | 5/1991 | Rodwell et al. |
| 5,274,271 A | * | 12/1993 | McEwan ................ 307/108 |
| 5,598,289 A | | 1/1997 | Watanabe |
| 6,064,872 A | * | 5/2000 | Vice ...................... 455/326 |
| 6,144,236 A | * | 11/2000 | Vice et al. .............. 327/113 |

(Continued)

FOREIGN PATENT DOCUMENTS

EP 0 372 825 A3 6/1990

(Continued)

OTHER PUBLICATIONS

Rodwell, M.J.W., et al. "Nonlinear Transmission Line for Picosecond Pulse Compression and Broadband Phase Modulation." *Electronic Letters.* vol. 23, No. 3 (Jan. 29, 1987): pp. 109-110. (Abstract).

(Continued)

*Primary Examiner*—Pablo N Tran
(74) *Attorney, Agent, or Firm*—Posz Law Group, PLC (57) ABSTRACT

A frequency converter (100) is provided, comprising: a pulse generator (150) configured to receive a balanced local oscillator signal pair and to generate a balanced rectangular pulse signal pair having the reference frequency; and a mixer (160) configured to mix an input signal having an input frequency with the balanced rectangular pulse signal pair to generate an output signal having an output frequency. The input frequency is different from the output frequency, and the pulse generator and the mixer are formed on a single integrated circuit (120). The frequency converter may comprise a balanced local oscillator (110) configured to generate the balanced local oscillator signal pair. The balanced local oscillator may comprise: an unbalanced local oscillator (130) configured to provide an unbalanced local oscillator signal having the reference frequency; and a balun (140) configured to generate the balanced local oscillator signal pair based on the unbalanced local oscillator signal.

20 Claims, 3 Drawing Sheets

U.S. PATENT DOCUMENTS

| | | |
|---|---|---|
| 6,239,637 B1 | 5/2001 | Williamson |
| 6,396,338 B1 | 5/2002 | Huang et al. |
| 6,522,221 B1 | 2/2003 | Hayashi |
| 6,690,247 B2 | 2/2004 | Kintis et al. |
| 6,826,208 B1 | 11/2004 | Birk |
| 6,850,575 B1 * | 2/2005 | Ahmed ........................ 375/301 |
| 6,894,581 B2 | 5/2005 | Noujiem |
| 7,462,956 B2 * | 12/2008 | Lan et al. ..................... 307/106 |
| 7,580,693 B2 * | 8/2009 | Rohde et al. ................. 455/326 |
| 7,612,629 B2 * | 11/2009 | Pepper ........................... 333/20 |
| 7,750,702 B2 * | 7/2010 | Ikeda ........................... 327/172 |
| 2006/0038551 A1 | 2/2006 | Agoston et al. |
| 2006/0114550 A1 | 6/2006 | Ricketts et al. |
| 2006/0125572 A1 | 6/2006 | Van Der Weide et al. |
| 2006/0158277 A1 | 7/2006 | Mrozek et al. |

FOREIGN PATENT DOCUMENTS

| | | |
|---|---|---|
| JP | 09018238 | 1/1997 |

OTHER PUBLICATIONS

Case, M., et al. "Picosecond Duration, Large-Amplitude Impulse Generation Using Electrical Soliton Effects on Monolithic GaAs Devices." *IEEE Transactions on Electron Devices*. vol. 39. Issue 11 (Nov. 1992): pp. 2668-2669.

\* cited by examiner

HIGH LINEARITY FREQUENCY CONVERSION SYSTEM AND METHOD

FIELD OF THE INVENTION

The present invention relates generally to the mixing of signals, and more particularly to a high linearity system and method for mixing an intermediate frequency (IF) signal to get a radio frequency (RF) signal or mixing an RF signal to get an IF signal.

BACKGROUND

Many signal processing and radio telecommunications systems make use of both radio frequencies (RF) and intermediate frequencies (IF) during operation. For example, AM and FM radio use an RF data signal with an IF carrier signal. In addition, some radar or microwave telecommunications applications also make use of RF and IF signals. In such devices a higher-frequency RF signal is transmitted over the air, while a lower-frequency IF signal is used for modulation/demodulation within transmitter and receiver circuitry.

Conversion between RF and typically takes place in a frequency converter that receives as its inputs a local oscillator (LO) signal and a signal for conversion (i.e., one of the IF signal and the RF signal), and provides as an output the frequency-converted signal (i.e., the other of the IF signal and the RF signal). Such a frequency converter may also be called a mixer.

In operation, if a frequency converter needs to upconvert an IF signal to an RF signal, it will receive the LO signal and the IF signal as inputs, and will provide the RF signal as an output. Likewise, if the frequency converter needs to downconvert an RF signal to an IF signal, it will receive the LO signal and the RF signal as inputs, and will provide the IF signal as an output. One exemplary frequency converter is the star mixer in Schottky diodes arranged in a star configuration.

Many modern communication systems require a high dynamic range of frequency converter operation, however. This means that a frequency converter for such devices must minimize distortion of IF and RF signals.

One limitation for meeting this high dynamic range requirement is the linearity of conventional frequency converters, i.e., the range for which the conventional frequency converters operate in a linear manner. Many conventional frequency converters have poor linearity performance in that they cannot provide the dynamic ranges required by some systems. For instance, a star mixer has a third order intermodulation that is about the same as a given LO drive level. This results in intermodulation distortion (IMD) and spurious responses, indicating that the star mixer has a relatively small range of linear operation.

It would therefore be desirable to provide a high linearity mixing circuit that provides linear operation over a wide range of RF and IF signal levels.

SUMMARY OF THE INVENTION

Accordingly, the present invention provides a frequency conversion circuit and method that experiences high-linearity performance over a wide range of frequencies.

A frequency converter is provided, comprising: a pulse generator configured to receive a balanced local oscillator signal pair having a reference frequency, and to generate a balanced rectangular pulse signal pair having the reference frequency; and a mixer configured to mix an input signal having an input frequency with the balanced rectangular pulse signal pair to generate an output signal having an output frequency. In this frequency converter, the input frequency is different from the output frequency, and the pulse generator and the mixer are formed on a single integrated circuit.

The single integrated circuit is a microwave integrated circuit. More particularly, the single integrated circuit is a monolithic integrated circuit.

The input frequency and the reference frequency may both be greater than the output frequency. Alternatively, the output frequency and the reference frequency may both be greater than the input frequency.

The frequency converter may further comprise a balanced local oscillator configured to generate the balanced local oscillator signal pair. The balanced local oscillator may comprise an unbalanced local oscillator configured to provide an unbalanced local oscillator signal having the reference frequency and a balun configured to generate the balanced local oscillator signal pair based on the unbalanced local oscillator signal. The balun may be formed on the single integrated circuit.

The pulse generator may comprise: a rectangular wave generator configured to receive the balanced local oscillator signal pair, and to generate a balanced rectangular wave signal pair having the reference frequency; and a reflector configured to delay and reflect the balanced rectangular wave signal pair to provide an inverted rectangular wave signal pair. In this case, the balanced rectangular pulse signal pair may be formed by a sum of the balanced rectangular wave signal pair and the inverted rectangular wave signal pair, and a width of the balanced rectangular pulse signal pair may be determined by a length of the delay. The reflection and delay process reduces the rise time and fall time of the pulse. The reflector may be a pair of shorted stubs.

Previous to its application to the reflector/delay stubs, each first rectangular waveform in the balanced rectangular wave signal pair may have a first steep edge that either rises from a low value to a high value or falls from the high value to the low value in a first edge time, and a first gentle edge that either rises from a low value to a high value or falls from the high value to the low value in a second edge time, the first edge time being smaller than the second edge time. Each second rectangular waveform in the inverted rectangular wave signal pair may have a second steep edge that either rises from a low value to a high value or falls from the high value to the low value in the first edge time, and a second gentle edge that either rises from a low value to a high value or falls from the high value to the low value in the second edge time. Each rectangular pulse in the balanced rectangular pulse signal pair may be defined by a first steep edge of one of the first rectangular waveforms, and a second steep edge of one of the second rectangular waveforms.

The reflector may comprise first and second reflector stubs, each having a stub length corresponding to the length of the delay. The mixer may comprise a transmission line, and the first reflector stub, the second reflector stub, and the transmission line may be formed by a three-line coplanar waveguide.

An integrated frequency conversion circuit is also provided, comprising: a nonlinear transmission line rectangular wave generator configured to convert a balanced local oscillator signal pair having a reference frequency into a balanced rectangular wave signal pair having the reference frequency; a reflector configured to delay and reflect the balanced rectangular wave signal pair to generate an inverted rectangular wave signal pair having faster rise and fall times than the original rectangular signal pair, and to add the balanced rectangular wave signal pair and the inverted rectangular wave signal pair to generate a rectangular pulse signal pair having the reference frequency; and a mixer configured to generate an output signal having an output frequency based on the balanced rectangular pulse signal pair and an input signal having an input frequency. In this circuit, the input frequency is different from the output frequency, and the non-linear transmission line rectangular wave generator, the reflector, and the mixer are formed on a single integrated circuit.

The reflector may further comprise: a first stub connected between a first transmission line output node of the nonlinear transmission line rectangular wave generator and an alternating current ground; and a second stub connected between a second transmission line output node of the nonlinear transmission line rectangular wave generator and a direct current ground. In this case, the nonlinear transmission line rectangular wave generator may be further configured to output a first balanced rectangular wave signal of the balanced rectangular wave signal pair at the first transmission line output node, the nonlinear transmission line rectangular wave generator may be further configured to output a second balanced rectangular wave signal of the balanced rectangular wave signal pair at the second transmission line output node, and the first and the second stubs may be substantially the same length.

The mixer may further comprise: a first diode connected in series between a first mixer input node and an intermediate node; a second diode connected in series between a second mixer input node and the intermediate node; a first transmission element connected between the intermediate node and a third mixer input node; and a second transmission element connected between the intermediate node and a mixer output node. In this case, a first orientation of the first diode with respect to the first mixer input node and the intermediate mixer node may be the same as a second orientation of the second diode with respect to the second mixer input node and the intermediate mixer node, and the mixer may be configured to receive the balanced rectangular pulse signal pair at the first and second mixer input nodes, respectively, is configured to receive the input signal at the third mixer input node, and is configured to provide the output signal at the mixer output node.

When the input frequency is greater than the output frequency, the first transmission element may comprise an inductor and the second transmission element comprises a transmission line, and when the input frequency is lower than the output frequency, the first transmission element may comprise a transmission line and the second transmission element comprises an inductor.

A method of frequency conversion is provided, comprising: receiving an input signal having an input frequency; generating a balanced local oscillator signal pair having a reference frequency; generating a balanced rectangular pulse signal pair having the reference frequency based on the balanced local oscillator signal pair; and mixing the balanced rectangular pulse signal pair with the input signal to provide an output signal having an output frequency. In this method, the input frequency is different from the output frequency, and the receiving of the input signal, the generating of the balanced rectangular pulse signal pair, and the mixing of the balanced rectangular pulse signal pair with the input signal are all performed on a single integrated circuit.

In one embodiment, the input frequency and the reference frequency are both greater than the output frequency. In another embodiment, the output frequency and the reference frequency are both greater than the input frequency.

The generating of the balanced pulse signal pair may further comprise: converting the balanced local oscillator signal pair into a balanced rectangular wave signal pair having the reference frequency; delaying and reflecting the balanced rectangular wave signal pair to generate an inverted rectangular wave signal pair having reduced rise times and fall times; and combining the balanced rectangular wave signal pair and the inverted rectangular wave signal pair to form the balanced rectangular pulse signal pair.

Each first rectangular waveform in the balanced rectangular wave signal pair may have a first steep edge that either rises from a low value to a high value or falls from the high value to the low value in a first edge time, and a first gentle edge that either rises from a low value to a high value or falls from the high value to the low value in a second edge time, the first edge time being smaller than the second edge time; each second rectangular waveform in the inverted rectangular wave signal pair may have a second steep edge that either rises from a low value to a high value or falls from the high value to the low value in the first edge time, and a second gentle edge that either rises from a low value to a high value or falls from the high value to the low value in the second edge time; and each rectangular pulse in the balanced rectangular pulse signal pair is defined by a first steep edge of one of the first rectangular waveforms, and a second steep edge of one of the second rectangular waveforms.

BRIEF DESCRIPTION OF THE DRAWINGS

The accompanying figures, where like reference numerals refer to identical or functionally similar elements throughout the separate views and which together with the detailed description below, are incorporated in and form part of the specification, serve to further illustrate various embodiments and to explain various principles and advantages all in accordance with the present invention.

DETAILED DESCRIPTION OF DISCLOSED EMBODIMENTS

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore or application specific ICs. One particular area of application is with respect to microwave monolithic integrated circuits (MMICs). It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the exemplary embodiments.

In addition, while applicants refer to radio frequency (RF) and intermediate frequency (IF) signals below, the disclosure should not be limited to use with such signals. It is applicable to any device requiring the conversion of signals between two different frequencies.

Applicants referring below to the drawings in which like numbers reference like components, and in which a single reference number may be used to identify an exemplary one of multiple like components.

Frequency Conversion Circuit

Figure 1:
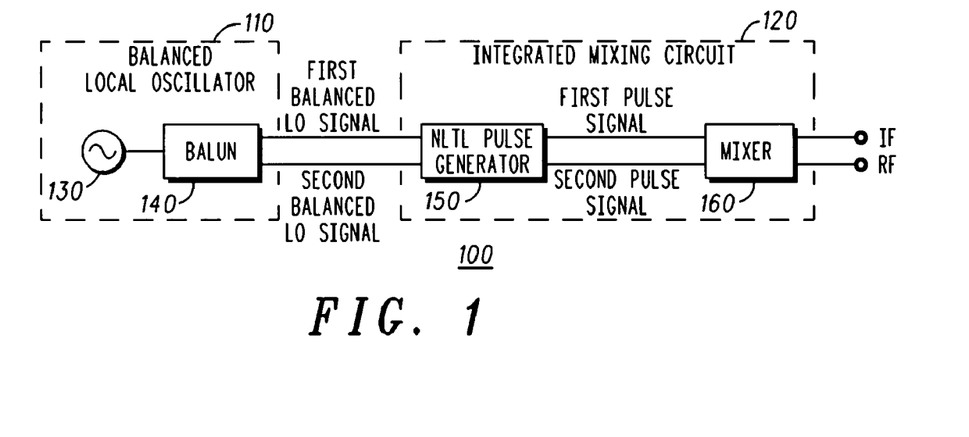
FIG. 1 is a block diagram of a frequency converter according to disclosed embodiments.

FIG. 1 is a block diagram of frequency converter 100 according to disclosed embodiments. Such a frequency converter 100 can also be generally referred to as a mixer.

As shown in FIG. 1, the frequency converter 100 includes a balanced local oscillator (LO) 110 and an integrated mixing circuit 120.

The balanced LO 110 generates a balanced LO signal pair, including a first balanced LO signal and a second balanced LO signal. The balanced LO 110 may include an unbalanced local oscillator 130 and a balun 140.

The unbalanced local oscillator 130 provides an unbalanced local oscillator signal to the balun at a desired LO frequency (i.e., a reference frequency), as would be well understood by one skilled in the relevant art.

The balun 140 accepts the unbalanced LO signal and converts it into a balanced LO signal pair, including a first balanced LO signal and a second balanced LO signal. In one embodiment, the balun 140 can be a Marchand balun. However, in alternate embodiments other types of baluns could be used.

Although in the embodiment disclosed in FIG. 1, the balanced LO 110 is shown as including both a unbalanced LO 130 and a balun 140, this is by way of example only. Alternate balanced LO designs are possible in which first and second balanced LO signals are provided using alternate circuitry, as would be understood by one skilled in the relevant art.

The integrated mixing circuit 120 accepts the first and second balanced LO signals and one of the IF and RF signals as converted input signal, and provides the other of the IF and RF signals as a converting output signal. Thus, it serves to either upconvert the IF signal to the RF signal or downconvert the RF signal to the IF signal, in conjunction with the first and second balanced LO signals. The integrated mixing circuit 120 is a single integrated circuit (IC) that includes both a non-linear transmission line (NLTL) pulse generator 150 and a signal mixer 160.

In one exemplary embodiment, the LO could be at a range of 20-40 GHz, the IF signal could be in the range of 0-18 GHz, and the RF signal could be in the range of 20-30 GHz. In another exemplary embodiment, the LO could be at a range of 9-11 GHz, the IF signal could be in the range of 0.1-3 GHz, and the RF signal could be in the range of 10-13 GHz. However, alternate embodiments could use any other frequencies.

The NLTL pulse generator 150 takes the first and second balanced LO signals (i.e., a balanced LO signal pair) and uses them to provide first and second pulse signals (i.e., a balanced square pulse signal pair) that have steep rise and fall times (i.e., sharp edges) and serve to define a balanced square pulse signal of a desired width and frequency to control operation of the signal mixer 160. The NLTL pulse generator 150 thus transforms the balanced LO signal pair (a sinusoid) into the balanced square pulse signal pair (a sharp, pulsed rectangular wave) having the same reference frequency as the balanced LO signal pair.

The signal mixer 160 receives the first and second pulse signals and one of the IF signal and the RF signal, and uses them to either upconvert the IF signal to the RF signal (if the IF signal is received as an input signal) or to downconvert the RF signal to the IF signal (if the RF signal is received as an input signal).

Although in the embodiment disclosed in FIG. 1, both the unbalanced LO 130 and the balun 140 are shown as being separate from the integrated mixing circuit 120, this is by way of example only. In alternate embodiments either the balun 140 or both the unbalanced LO 130 and the balun 140 could be included in the integrated mixing circuit 120 (i.e., unified on the same MMIC as the NLTL pulse generator 150 and the signal mixer 160).

In addition, although FIG. 1 discloses the use of an NLTL pulse generator 150, other pulse generators that do not employ an NLTL could be used in alternate embodiments.

Figure 2:
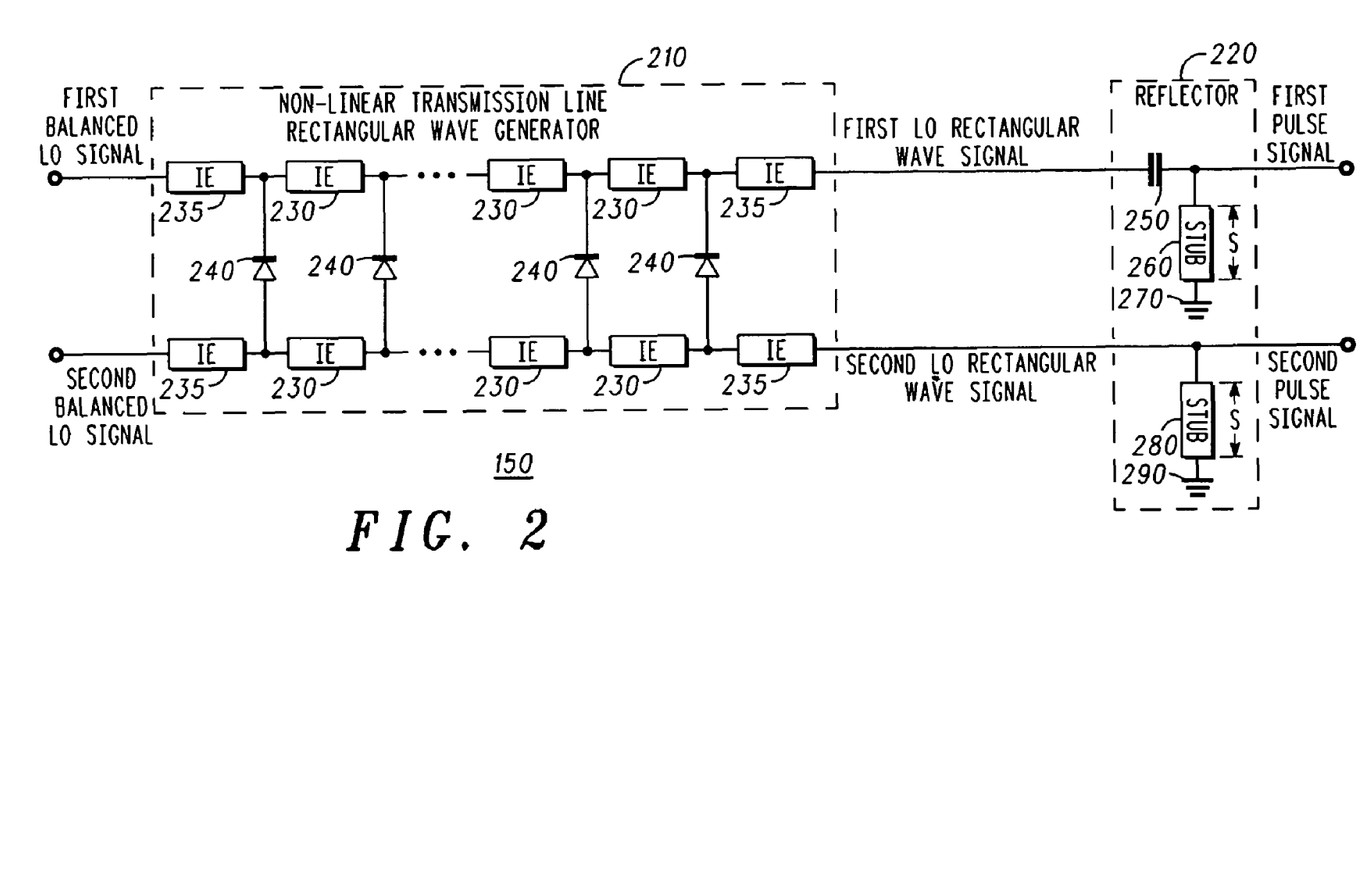
FIG. 2 is a block diagram of the non-linear transmission line pulse generator of FIG. 1 according to disclosed embodiments.

The rectangular pulse generator 150 uses a nonlinear transmission line (NLTL) circuit. As shown in FIG. 2, one exemplary NLTL circuit is a high-impedance coplanar transmission line loaded with reverse-biased diodes at regular intervals along the line which create variable shunt capacitance with voltage. The nonlinear shunt capacitance causes a variation in the propagation velocity of the wave according to its voltage, which results in a steepening of a negative-going wave front of a signal propagating along the line. This steepening pulse can have a very fast edge time that is in the picosecond or sub-picosecond range. The pulse can also have a fast rise or fall time depending on the biasing conditions.

Such an NLTL pulse generator requires a reflector (e.g., a short-circuit stub) to square the LO waveform. Without such a stub, the LO voltage could look like a distorted sinusoid, with a fast rise time and slow fall time (or alternatively, a slow rise time and a fast fall time). This condition is undesirable whenever high linearity (i.e., low distortion) is required. In such cases, the desired waveform would want both the rise time and the fall time to be as fast as possible.

One exemplary implementation is to create a shorted stub at the end of the line such that the incoming waveform is reflected on to itself. In such a case, signals cancel each other out in such a way that a very narrow pulse (e.g., a rectangular wave) with extremely fast rise and fall time is generated. Furthermore, the length of the stub can act as a tuning adjustment for pulse width.

FIG. 2 is a block diagram of the NLTL pulse generator of FIG. 1 according to disclosed embodiments. As shown in FIG. 2, the NLTL pulse generator 150 includes an NLTL rectangular wave generator 210 and a reflector 220.

The NLTL rectangular wave generator 210 receives as input signals the first and second balanced LO signals, and generates as output signals first and second LO rectangular wave signals (which can also be called balanced rectangular wave signals). The NLTL rectangular wave generator 210 includes a plurality of inductive elements 230 and 235, and a plurality of diodes 240. In some embodiments the rectangular wave generator 210 can be a square wave generator providing square waves that are fifty percent on and fifty percent off, though this is not required. For example, a non-square rectangular wave may be desirable for certain high frequency operations.

The plurality of inductive elements 230 and 235 are formed as two parallel NLTL signal lines, each including two inductive elements 235 and a plurality of inductive elements 230 in series. The two inductive elements 235 in each signal line are formed at opposite ends of the series of inductive elements 230. The two signal lines in this embodiment are formed of the same number of inductive elements 230 and 235. One signal line is connected between the first balanced LO signal and the first LO rectangular wave signal, and the other signal line is connected between the second balanced LO signal and the second LO rectangular wave signal.

In this embodiment, all of the inductive elements 230 are of the same size and all of the inductive elements 235 are of the same size. In addition, the inductive elements 235 are each half the size of one of the inductive elements 230. However, this is by way of example only. In alternate embodiments the size of the various inductive elements 230 and 235 can be varied to obtain the desired signal performance for the LO rectangular wave generated by the NLTL rectangular wave generator 210.

The plurality of diodes 240 are each formed between a corresponding intersections between an inductive element 230 and an inductive element 235 or between two inductive elements 230 in the first and second signal lines. Thus, the number of diodes 240 is one less than the number of inductive elements 230 and 235 in each signal line. Furthermore, each of the diodes 240 is oriented in the same direction. In the embodiment of FIG. 2, the diodes 240 are all oriented to pass current from the second signal line to the first signal line. However, in alternate embodiments the orientation of the diodes 240 could be reversed. In this case the operation of the NLTL rectangular wave generator 210 described below would be reversed.

The number of diodes 240 and inductive elements 230 and 235 used, as well as the size of the inductive elements 230 and 235 and the functional characteristics of the diodes 240, will determine the frequency range of the NLTL rectangular wave generator 210 and the sharpness (rise/fall time) of the rectangular wave. The details of such design parameters would be well known to one skilled in the relevant art, and can be varied at need to achieve desired operational parameters.

In operation, the NLTL rectangular wave generator 210 of FIG. 2 received the balanced LO signal and generates a rectangular wave signal with a sharp rising transition and a more sloped falling transition that has the same reference frequency as the balanced LO signal. Because of the diodes' non-linear capacitance, low voltages propagate faster than high voltages. Thus, when the balanced LO signal passes through the NLTL rectangular wave generator 210, the end of a rising (i.e., positive-going) transition can catch up to the initial part of the transition, creating a very fast step in the resulting rectangular wave signal. However, the negative transition is slowed, resulting in a less sharp falling (i.e., negative-going) transition.

The reflector 220 receives the first and second LO rectangular wave signals and based on these input signals generates the first and second pulse signals as output signals. The reflector 220 has two signal paths going through it, and includes a capacitor 250 and a pair of stubs 260 and 280.

The capacitor 250 is located on a first signal path through the reflector 220 between the first LO rectangular wave signal and the first pulse signal. It acts to insulate the first pulse signal from DC signal elements.

The stubs 260 and 280 are provided between a corresponding signal path and a corresponding ground node 270 and 290. Both stubs 260 and 280 are of the same stub length S. In this embodiment the stub 260 is provided between the first signal path and a DC ground node 270, such that the capacitor 250 is between it and the NLTL rectangular wave generator 210, while the stub 280 is provided between the second signal path and the DC ground 290.

The length S of the stubs 260 and 280 is determined based on the desired width and frequency of a pulse needed to control operation of the mixer 160 (i.e., the balanced rectangular pulse defined by the first and second pulse signals), effectively acting as a tuning adjustment for the design. This is because the stub length S effects the duty cycle of the diode conductance in the signal mixer (See FIG. 3), which in turn effects RF impedance, IF impedance, and conversion efficiency. In some embodiments S is equal to one-quarter of the wavelength of the LO rectangular wave generated by the NLTL rectangular wave generator 210 (i.e., one-quarter of the wavelength of the unbalanced LO 130), though it can vary in alternate embodiments.

Although FIG. 2 discloses a reflector that employs a pair of stubs 260 and 280 connected to ground nodes 270 and 290 to generate an inverted square signal pair, alternated embodiments could employ other reflector designs to create the inverted square signal pair.

Figure 3:
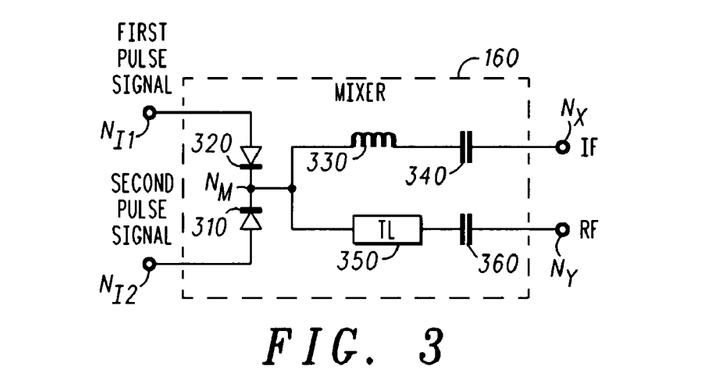
FIG. 3 is a block diagram of the signal mixer of FIG. 1 according to disclosed embodiments.

FIG. 3 is a block diagram of a mixer of FIG. 1 according to disclosed embodiments. As shown in FIG. 3, the signal mixer 160 includes a diode 310, a diode 320, an inductor 330, a capacitor 340, a transmission line 350, and a capacitor 360.

The diode 310 is connected between an input node $N_{I1}$ and an intermediate node $N_M$, and is oriented to allow current to pass from the input node $N_{I1}$ to the intermediate node $N_M$. Similarly, the diode 320 is connected between an input node $N_{I2}$ and the intermediate node $N_M$, and is oriented to allow current to pass from the input node $N_{I2}$ to the intermediate node $N_M$. In alternate embodiments, however, the orientation of the diodes 310 and 320 can be reversed such that the diode 310 is oriented to allow current to pass from the intermediate node $N_M$ to the input node $N_{I2}$, and the diode 320 is oriented to allow current to pass from the intermediate node $N_M$ to the input node $N_{I2}$. In the embodiment of FIG. 3, the diodes 310 and 320 are Schottky diodes. However, in alternate embodiments, different diode designs could be used.

The inductor 330 and the capacitor 340 are connected in series between the intermediate node $N_M$ and an input/output node $N_X$, with the inductor 330 closer to the intermediate node $N_M$ and the capacitor closer to the input/output node $N_X$. Similarly, the transmission line 350 and the capacitor 340 are connected in series between the intermediate node $N_M$ and an input/output node $N_Y$, with the transmission line 350 closer to the intermediate node $N_M$ and the capacitor 360 closer to the input/output node $N_Y$. The capacitors 340 and 360 serve to insulate the elements in the signal mixer 160 from DC components at the input/output nodes $N_X$ and $N_Y$.

The input/output node $N_X$ is for receiving or providing the IF signal, and the input/output node $N_Y$ is for receiving or providing the RF signal, both depending upon the operation mode. In one operation mode, the input/output node $N_X$ is an input node for receiving the IF signal and the input/output node $N_Y$ is an output node for providing the RF signal, and in another operation mode, the input/output node $N_Y$ is an input node for receiving the RF signal and the input/output node $N_X$ is an output node for providing the IF signal.

As would be understood to one skilled in the art, the transmission line 350 can be represented one or more resistive-inductive elements connected in series between the two ends of the transmission line 350, with one or more resistive-capacitive elements in parallel, connecting one or more portions of the resistive-inductive elements to ground. In one particular embodiment, the transmission line can be represented as two inductive elements in series between the two ends of the transmission line 350, with a capacitive element connecting the juncture of the two inductive elements to ground. However, other representations of the transmission line are possible.

Operation of the Integrated Mixing Circuit

In the integrated mixing circuit 120 of FIGS. 1-3, the NLTL pulse generator 150 transforms a balanced LO signal pair into a balanced rectangular pulse signal pair (which could be called the rectangular pulse signal or the rectangular pulse signal pair for simplicity), and the signal mixer 160 uses the rectangular pulse signal pair to either upconvert the IF signal to the RF signal or downconvert the RF signal to the IF signal.

More particularly, in the NLTL pulse generator 150 the NLTL rectangular wave generator 210 converts the balanced LO signal pair into a rectangular wave signal pair, and the reflector 220 converts the balanced rectangular wave signal pair into the rectangular pulse signal pair.

Figure 4:
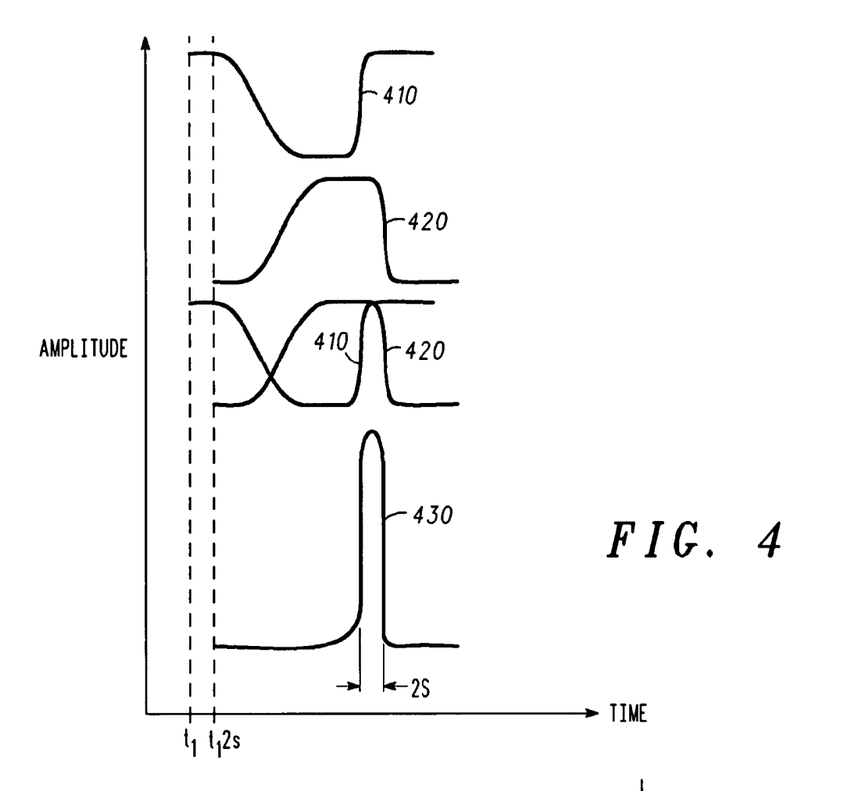
FIG. 4 is a graph of the operation of a non-linear transmission line pulse generator according to disclosed embodiments.

FIG. 4 is a graph of the operation of a NLTL pulse generator 150 according to disclosed embodiments. As shown in FIG. 4, an LO rectangular waveform 410 from the balanced LO rectangular wave is an exemplary output of a single waveform from the NLTL rectangular wave generator 210 (as defined by the first and second LO rectangular wave signals). This LO rectangular wave form 410 is actually not a true rectangular wave, but only an approximation of a rectangular wave, with one steep edge and one gentle edge.

One portion of this LO rectangular waveform 410 passes from the NLTL square wave generator 210, through the reflector 220 and forms one part of the rectangular pulse signal (as defined by the first and second pulse signals). Another portion of the LO rectangular waveform 410 passes through the stubs 260 and 280 and is reflected when it reaches the corresponding ground node 270 or 290. This delays and reflects the LO rectangular waveform 410 to generate an inverted rectangular waveform 420 that is provided as another part of the rectangular pulse signal. And because the stubs 260 and 280 each have a length S, the inverted rectangular waveform 420 will be delayed by a time 2S, as compared to the LO rectangular waveform 410.

A combination of the LO rectangular waveform 410 and the inverted rectangular waveform 420 form the balanced rectangular pulse signal pair. The two combine at their respective nodes, NI1 and NI2 in FIG. 3, to generate each pulse in the rectangular pulse signal pair. Because of the reflection of the LO rectangular waveform 410, the inverted rectangular waveform 420 will cancel out a majority of the LO rectangular waveform 410, except for a small portion of length 2S between the two sharp edges. It should be noted, however, that while this description refers to the combination taking place in the reflector 220, it could just as easily be considered as occurring at the input nodes of the signal mixer 160.

As a result of this signal delay, reflection, and addition, the NLTL pulse generator 150 can provide a narrow pulse 430 of length 2S that can be used as the local oscillator signal in the mixer 160. Because the sharp rising edge and its reflection define this narrow pulse 430, the narrow pulse 430 has both a sharp rising edge and a sharp falling edge. In this way an electronic shock wave with sharp edges (e.g., in the picosecond or sub-picosecond range) is possible. In addition, the resulting ultra-short pulse is very harmonically rich.

As shown in FIG. 3, the signal mixer 160 uses the diodes 310 and 320 as a pair of switched diodes to control the mixing, with the first and second pulse signals (i.e., the rectangular pulse signal pair that defines a plurality of narrow pulses 430) as a balanced control signal. By providing a very sharp LO rectangular wave signal pair to the signal mixer 160 at the same reference frequency as the original unbalanced LO signal, the NLTL pulse generator 150 can turn the diodes 310 and 320 on and off more rapidly than would be the case if they received either the LO rectangular wave signal pair (which has one steep edge and one gentle edge in each rectangular waveform) or the balanced LO signal pair (which has a sinusoidal waveform). This rapid switching will provide for lower levels of intermodulation distortion (IMD) and reduce the levels of spurious responses of the mixer.

In practice, one of the biggest challenges in such a design is to generate a sharp enough LO rectangular pulse waveform operating at the desired frequency range (e.g., at a microwave frequency range for an MMIC device). But as shown in FIG. 4, the present design addresses that challenge by using the NLTL rectangular wave generator 210 and reflector 220 in the NLTL pulse generator 150 to create one.

Furthermore, since the mixer 160 is very sensitive to loading effects, it is helpful to minimize the number of transitions between the pulse generator 150 and the signal mixer 160. In addition, a sharp rectangular wave generator requires high order harmonic content, which makes it desirable to preserve a wide bandwidth interface of the LO 110 and the mixer core.

Both of these goals can be met by having the NLTL pulse generator and the mixer 160 formed in the same integrated mixing circuit 120. In various embodiments the integrated mixing circuit 120 can be implemented using MMIC NLTL technology, potentially including diodes, heterojunction bipolar transistor (HBT), high-electron-mobility transistor (HEMT), and complementary metal oxide semiconductor (CMOS) devices on a single chip. This can minimize parasitic capacitances allowing for an improved signal transition, particularly when operating at high frequencies.

Also, in some embodiments the stubs 260 and 280 can be formed with the transmission line 350 as a three-line RF structure, which can be considered a coplanar waveguide with a truncated ground. The transmission line 350 can be formed from the center conductor, and the stubs 260 and 280 can be formed from the outer conductors. In such an embodiment, the RF input/output would be connected to the three-line RF structure at its center conductor.

Furthermore, although a single balance diode mixer is disclosed in FIG. 3 as one embodiment of the signal mixer 160, other embodiments could use different configurations of signal mixer.

Frequency Conversion Method

Figure 5:
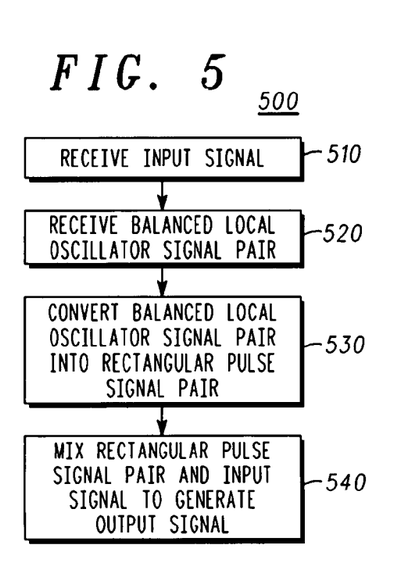
FIG. 5 is a flow chart of a frequency conversion operation according to disclosed embodiments.

FIG. 5 is a flow chart of a frequency conversion operation according to disclosed embodiments. This can be either an upconversion of an IF signal to an RF signal or a downconversion of an RF signal to an IF signal, depending upon a mode of operation.

As shown in FIG. 5, the operation begins when a frequency converter receives an input signal. (510) As noted above, this could be an RF or an IF signal, depending upon the mode of operation.

The frequency converter then receives a balanced local oscillator (LO) signal pair. (520) This balanced LO signal pair serves to provide a reference frequency for the frequency conversion of the input signal.

The frequency converter then converts the balanced LO signal pair into a rectangular pulse signal pair (i.e., one with sharp rise and fall times). (530)

Finally, the frequency converter mixes the balanced pulse signal pair with the input signal to generate an output signal. (540) If the input signal is the RF signal, then the frequency conversion process is a downconversion process and the output signal is the IF signal; if the input signal is the IF signal, then the frequency conversion process is an upconversion process and the output signal is the RF signal.

By moving from a sinusoidal LO signal to a rectangular pulse, the frequency converter provides a sharper voltage transition that can allow for faster switching during a mixing operation (540), leading to a greater frequency range in which the frequency conversion process is linear.

Furthermore, if the conversion of the balanced LO signal pair into a balanced pulse signal pair (530) and the mixing of the balanced pulse signal pair with the input signal to generate an output signal (540) are performed on the same integrated circuit, then this operation can limit the effect of parasitic capacitances on such operations, enhancing their performance, particularly at high frequencies.

Although FIG. 5 shows the frequency converter receiving an input signal (510) prior to receiving a balanced local oscillator pair (520), this is by way of example only. The frequency converter could receive the two in any order, and in fact, could receive the two at the same time.

Figure 6:
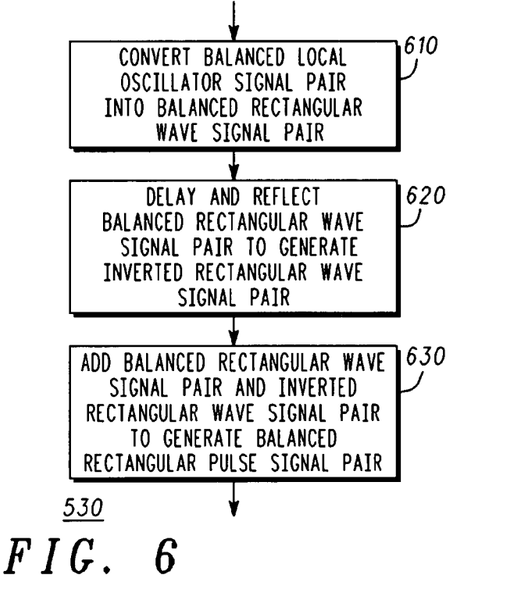
FIG. 6 is a flow chart of the operation of converting a balanced local oscillator signal pair into a balanced square pulse signal pair of FIG. 5 according to disclosed embodiments.

FIG. 6 is a flow chart of an operation of converting a balanced LO signal pair into a balanced rectangular pulse signal pair of FIG. 6 according to disclosed embodiments.

As shown in FIG. 6, the conversion operation begins when a conversion element converts a balanced LO signal pair into a balanced rectangular wave signal pair. (610)

The conversion element then delays and reflects the balanced rectangular wave signal pair to generate an inverted rectangular wave signal pair. (620) This inverted rectangular wave signal pair is both inverted and delayed with respect to the balanced rectangular wave signal pair.

Finally the conversion element adds the balanced LO rectangular wave signal pair to the inverted rectangular wave signal pair to generate the balanced pulse signal pair (630), which has good rising and falling edges.

It should be appreciated, however, that the operation described with respect to FIG. 6 is simply one embodiment of the conversion operation (530) of FIG. 5. Alternate embodiments could achieve the conversion of the balanced LO signal pair to a balanced pulse signal pair using different signal processing operations.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A frequency converter, comprising:
 a pulse generator configured to receive a balanced local oscillator signal pair having a reference frequency, and to generate a balanced rectangular pulse signal pair having the reference frequency; and
 a mixer configured to mix an input signal having an input frequency with the balanced rectangular pulse signal pair to generate an output signal having an output frequency;
 wherein the pulse generator comprises:
  a rectangular wave generator configured to receive the balanced local oscillator signal pair, and to generate a balanced rectangular wave signal pair having the reference frequency; and
  a reflector configured to delay and reflect the balanced rectangular wave signal pair to provide an inverted rectangular wave signal pair,
 wherein the balanced rectangular pulse signal pair is formed by a sum of the balanced rectangular wave signal pair and the inverted rectangular wave signal pair, and
 wherein a width of the balanced rectangular pulse signal pair is determined by a length of the delay,
 wherein the input frequency is different from the output frequency, and
 wherein the pulse generator and the mixer are formed on a single integrated circuit.

2. The frequency converter recited in claim 1, wherein the single integrated circuit is a microwave integrated circuit.

3. The frequency converter recited in claim 1, wherein the single integrated circuit is a monolithic integrated circuit.

4. The frequency converter recited in claim 1, wherein the input frequency and the reference frequency are both greater than the output frequency.

5. The frequency converter recited in claim 1, wherein the output frequency and the reference frequency are both greater than the input frequency.

6. The frequency converter recited in claim 1, further comprising a balanced local oscillator configured to generate the balanced local oscillator signal pair.

7. The frequency converter recited in claim 6, wherein the balanced local oscillator further comprises:
 an unbalanced local oscillator configured to provide an unbalanced local oscillator signal having the reference frequency; and
 a balun configured to generate the balanced local oscillator signal pair based on the unbalanced local oscillator signal.

8. The frequency converter recited in claim 7, wherein the balun is formed on the single integrated circuit.

9. The frequency converter recited in claim 1, wherein the reflector is a pair of shorted stubs.

10. The frequency converter recited in claim 1,
 wherein each first rectangular waveform in the balanced rectangular wave signal pair has a first steep edge that either rises from a low value to a high value or falls from the high value to the low value in a first edge time, and a first gentle edge that either rises from a low value to a high value or falls from the high value to the low value in a second edge time, the first edge time being smaller than the second edge time, wherein each second rectangular waveform in the inverted rectangular wave signal pair has a second steep edge that either rises from a low value to a high value or falls from the high value to the low value in the first edge time, and a second gentle edge that either rises from a low value to a high value or falls from the high value to the low value in the second edge time, wherein each rectangular pulse in the balanced rectangular pulse signal pair is defined by a first steep edge of one of the first rectangular waveforms, and a second steep edge of one of the second rectangular waveforms.

11. The frequency converter recited in claim 1, wherein the reflector comprises first and second reflector stubs, each having a stub length corresponding to the length of the delay.

12. The frequency converter recited in claim 1,
wherein the mixer comprises a transmission line, and
wherein the first reflector stub, the second reflector stub, and the transmission line are formed by a three-line coplanar waveguide.

13. An integrated frequency conversion circuit, comprising:
a non-linear transmission line rectangular wave generator configured to convert a balanced local oscillator signal pair having a reference frequency into a balanced rectangular wave signal pair having the reference frequency;
a reflector configured to delay and reflect the balanced rectangular wave signal pair to generate an inverted rectangular wave signal pair having faster rise and fall times than the original rectangular signal pair, and to add the balanced rectangular wave signal pair and the inverted rectangular wave signal pair to generate a rectangular pulse signal pair having the reference frequency; and
a mixer configured to generate an output signal having an output frequency based on the balanced rectangular pulse signal pair and an input signal having an input frequency,
wherein the input frequency is different from the output frequency, and
wherein the non-linear transmission line rectangular wave generator, the reflector, and the mixer are formed on a single integrated circuit.

14. The integrated frequency conversion circuit of claim 13, wherein the reflector further comprises:
a first stub connected between a first transmission line output node of the non-linear transmission line rectangular wave generator and an alternating current ground; and
a second stub connected between a second transmission line output node of the non-linear transmission line rectangular wave generator and a direct current ground,
wherein the non-linear transmission line rectangular wave generator is further configured to output a first balanced rectangular wave signal of the balanced rectangular wave signal pair at the first transmission line output node,
wherein the non-linear transmission line rectangular wave generator is further configured to output a second balanced rectangular wave signal of the balanced rectangular wave signal pair at the second transmission line output node, and wherein the first and the second stubs are substantially the same length.

15. The integrated frequency conversion circuit of claim 13, wherein the mixer further comprises:
a first diode connected in series between a first mixer input node and an intermediate node;
a second diode connected in series between a second mixer input node and the intermediate node;
a first transmission element connected between the intermediate node and a third mixer input node; and
a second transmission element connected between the intermediate node and a mixer output node,
wherein a first orientation of the first diode with respect to the first mixer input node and the intermediate mixer node is the same as a second orientation of the second diode with respect to the second mixer input node and the intermediate mixer node, and
wherein the mixer is configured to receive the balanced rectangular pulse signal pair at the first and second mixer input nodes, respectively, is configured to receive the input signal at the third mixer input node, and is configured to provide the output signal at the mixer output node.

16. The integrated frequency conversion circuit of claim 15,
wherein when the input frequency is greater than the output frequency, the first transmission element comprises an inductor and the second transmission element comprises a transmission line, and
wherein when the input frequency is lower than the output frequency, the first transmission element comprises a transmission line and the second transmission element comprises an inductor.

17. A method of frequency conversion, comprising:
receiving an input signal having an input frequency;
generating a balanced local oscillator signal pair having a reference frequency;
generating a balanced rectangular pulse signal pair having the reference frequency based on the balanced local oscillator signal pair; and
mixing the balanced rectangular pulse signal pair with the input signal to provide an output signal having an output frequency,
wherein the generating of the balanced pulse signal pair further comprises:
converting the balanced local oscillator signal pair into a balanced rectangular wave signal pair having the reference frequency;
delaying and reflecting the balanced rectangular wave signal pair to generate an inverted rectangular wave signal pair having reduced rise times and fall times as compared to the balanced rectangular wave signal pair; and
combining the balanced rectangular wave signal pair and the inverted rectangular wave signal pair to form the balanced rectangular pulse signal pair,
wherein the input frequency is different from the output frequency, and
wherein the receiving of the input signal, the generating of the balanced rectangular pulse signal pair, and the mixing of the balanced rectangular pulse signal pair with the input signal are all performed on a single integrated circuit.

18. The method of frequency conversion recited in claim 17, wherein the input frequency and the reference frequency are both greater than the output frequency.

19. The method of frequency conversion recited in claim 17, wherein the output frequency and the reference frequency are both greater than the input frequency.

20. The method of frequency conversion recited in claim 17,
wherein each first rectangular waveform in the balanced rectangular wave signal pair has a first steep edge that either rises from a low value to a high value or falls from the high value to the low value in a first edge time, and a first gentle edge that either rises from a low value to a high value or falls from the high value to the low value in a second edge time, the first edge time being smaller than the second edge time,
wherein each second rectangular waveform in the inverted rectangular wave signal pair has a second steep edge that either rises from a low value to a high value or falls from the high value to the low value in the first edge time, and a second gentle edge that either rises from a low value to a high value or falls from the high value to the low value in the second edge time,
wherein each rectangular pulse in the balanced rectangular pulse signal pair is defined by a first steep edge of one of the first rectangular waveforms, and a second steep edge of one of the second rectangular waveforms.

* * * * *